United States Patent
Tseng et al.

(10) Patent No.: US 9,459,473 B2
(45) Date of Patent: Oct. 4, 2016

(54) INTEGRATED GATE DRIVER CIRCUIT FOR ELIMINATING VOLTAGE FLUCTUATION AND LIQUID CRYSTAL PANEL WITH THE SAME

(71) Applicant: HannStar Display Corp., New Taipei (TW)

(72) Inventors: Chun-Chin Tseng, Kaohsiung (TW); Ya-Wen Lee, Tainan (TW); Kuo-Wen Pan, Kaohsiung (TW)

(73) Assignee: HANNSTAR DISPLAY CORP, New Taipei (TW)

( * ) Notice: Subject to any disclaimer, the term of this patent is extended or adjusted under 35 U.S.C. 154(b) by 343 days.

(21) Appl. No.: 13/771,806

(22) Filed: Feb. 20, 2013

(65) Prior Publication Data

US 2013/0335665 A1 Dec. 19, 2013

(30) Foreign Application Priority Data

Jun. 14, 2012 (CN) .......................... 2012 1 0198895

(51) Int. Cl.
| | |
|---|---|
| *G09G 3/36* | (2006.01) |
| *G02F 1/133* | (2006.01) |
| *H03K 17/16* | (2006.01) |
| *G09G 5/18* | (2006.01) |
| *G11C 19/28* | (2006.01) |
| *G09G 5/00* | (2006.01) |

(52) U.S. Cl.
CPC ......... *G02F 1/13306* (2013.01); *G09G 3/3677* (2013.01); *G09G 5/18* (2013.01); *G11C 19/28* (2013.01); *H03K 17/16* (2013.01); *H03K 17/161* (2013.01); *G09G 5/008* (2013.01); *G09G 2310/0286* (2013.01); *G09G 2310/08* (2013.01); *G09G 2330/021* (2013.01); *G09G 2370/08* (2013.01)

(58) Field of Classification Search
CPC .......................... G09G 3/3674; G09G 3/3677
See application file for complete search history.

(56) References Cited

U.S. PATENT DOCUMENTS

| | | |
|---|---|---|
| 8,049,703 B2 | 11/2011 | Chang et al. |
| 8,299,821 B2 | 10/2012 | Chen et al. |
| 8,300,002 B2 | 10/2012 | Chang et al. |

(Continued)

FOREIGN PATENT DOCUMENTS

| | | |
|---|---|---|
| CN | 1641740 A | 7/2005 |
| CN | 101783124 A | 7/2010 |

(Continued)

OTHER PUBLICATIONS

USPTO Office Action mailed Apr. 8, 2015 in U.S. Appl. No. 14/192,243.

*Primary Examiner* — Jonathan Blancha
(74) *Attorney, Agent, or Firm* — Hauptman Ham, LLP

(57) ABSTRACT

An integrated gate driver circuit includes a control circuit, a plurality of drive stages and a plurality of discharge transistors. The control circuit is configured to output a plurality of clock signals within a frame period and to output a discharge enabling signal within a blanking period of the frame period. Each of the drive stages receives the clock signals and includes an output terminal configured to output a gate driving signal. Each of the discharge transistors is coupled to the output terminal of one of the drive stages and discharges the output terminal according to the discharge enabling signal thereby eliminating the voltage fluctuation of the output terminal in the blanking period.

20 Claims, 8 Drawing Sheets

(56) References Cited

U.S. PATENT DOCUMENTS

| | | |
|---|---|---|
| 8,305,329 B2 | 11/2012 | Chen et al. |
| 2005/0068284 A1* | 3/2005 | Joo .................................. 345/99 |
| 2005/0179682 A1 | 8/2005 | Shin et al. |
| 2009/0283763 A1 | 11/2009 | Park et al. |
| 2010/0109996 A1* | 5/2010 | Park et al. .................... 345/100 |
| 2011/0069044 A1 | 3/2011 | Lee et al. |
| 2011/0157263 A1 | 6/2011 | Kim et al. |
| 2012/0188210 A1* | 7/2012 | Zhang .................. G09G 3/3677 345/204 |
| 2012/0194773 A1* | 8/2012 | Kim et al. .................... 349/139 |
| 2013/0009919 A1 | 1/2013 | Park et al. |

FOREIGN PATENT DOCUMENTS

| | | |
|---|---|---|
| CN | 102024437 A | 4/2011 |
| TW | 201115548 A | 5/2011 |

* cited by examiner

| rising edge | STV | CLK1 | CLK2 | CLK3 | CLK4 |
|---|---|---|---|---|---|
| NODE Y | H | H | H | L | L |
| Output1 | H STV CLK1 overlap | H | H CLK1 CLK2 overlap | L | L |
| T1 | ON | ON STV CLK1 overlap | ON STV CLK2 overlap | OFF | OFF |
| T2 | ON | ON | ON | OFF | OFF |
| T3 | OFF | OFF | OFF | ON | OFF |
| T4 | OFF | OFF | OFF | OFF | ON |
| T5 | OFF | OFF | OFF | ON | OFF |

FIG. 5C

INTEGRATED GATE DRIVER CIRCUIT FOR ELIMINATING VOLTAGE FLUCTUATION AND LIQUID CRYSTAL PANEL WITH THE SAME

CROSS REFERENCE TO RELATED APPLICATION

This application claims the priority benefit of Chinese Patent Application Number 201210198895.5, filed on Jun. 14, 2012, the full disclosure of which is incorporated herein by reference.

BACKGROUND

1. Field of the Disclosure

This disclosure generally relates to a liquid crystal display and, more particularly, to an integrated gate driver circuit and a liquid crystal panel using the same.

2. Description of the Related Art

The conventional liquid crystal display generally includes a plurality of gate driver circuits configured to drive a pixel matrix. In order to reduce the manufacturing cost and to efficiently use the substrate space, gate drivers and the pixel matrix can both be formed on the substrate surface, wherein said gate drivers are named the integrated gate driver circuit.

Referring to FIG. 1, it shows a schematic block diagram of the conventional integrated gate driver circuit 9 including a control circuit 91 and a plurality of drive stages $92_1$-$92_4$ . . . . The control circuit 91 outputs a plurality of clock signals CLK to the drive stages $92_1$-$92_4$ . . . , and the clock signals CLK include, for example, CLK1-CLK4, refer to FIG. 2. The drive stages $92_1$-$92_4$ . . . respectively output an output signal Output 1-Output 4 . . . for driving one gate line.

Referring to FIG. 2, it shows a timing diagram of the clock signals and the output signals of the integrated gate driver circuit 9 shown in FIG. 1. Firstly the control circuit 91 outputs a start vertical frame signal STV to the first drive stage $92_1$ and then sequentially outputs a part of the clock signals CLK1-CLK4 (e.g. CLK1-CLK3) to every drive stage. After receiving a part of the clock signals CLK, the first drive stage $92_1$ outputs an output signal Output 1, which is a replica of the first waveform of the clock signal CLK1; after receiving a part of the clock signals CLK the second drive stage $92_2$ outputs an output signal Output 2, which is a replica of the first waveform of the clock signal CLK2; after receiving a part of the clock signals CLK the fifth drive stage $92_5$ outputs an output signal Output 3, which is a replica of the second waveform of the clock signal CLK1; after receiving a part of the clock signals CLK the sixth drive stage $92_6$ outputs an output signal Output 4, which is a replica of the second waveform of the clock signal CLK2; and so on.

In order to reduce the power consumption of the integrated gate driver circuit 9, the control circuit 91 will stop outputting any clock signal to the drive stages $92_1$-$92_4$ . . . between two image frames; that is, in a time interval after the last drive stage outputs an output signal Output n of a first image frame and before the first drive stage $92_1$ outputs an output signal Output 1 of a second image frame, referring to FIG. 3, the control circuit 91 does not output any clock signal. However, during the time interval that the drive stages $92_1$-$92_4$ . . . do not receive any clock signal, the voltage value of the output signals Output 1-Output n . . . may have the voltage fluctuation as shown in FIG. 3, and this voltage fluctuation can influence the gate driving signals in the second image frame.

Accordingly, the present disclosure further provides an integrated gate driver circuit and a liquid crystal panel that can eliminate the voltage fluctuation on the gate lines in a blanking period between two image frames.

SUMMARY

The present disclosure provides an integrated gate driver circuit and a liquid crystal panel that utilize a plurality of discharge transistors to discharge every gate line within the blanking period between two frame periods thereby eliminating the voltage fluctuation on the gate lines in the blanking period.

The present disclosure further provides an integrated gate driver circuit and a liquid crystal panel that generate a discharge enabling signal within the blanking period between two frame periods so as to discharge the gate lines.

The present disclosure provides an integrated gate driver circuit includes a control circuit, a drive stage and a discharge transistor. The control circuit is configured to output a plurality of clock signals within a frame period and output a discharge enabling signal within a blanking period. The drive stage receives the clock signals and includes an output terminal configured to output a gate driving signal. The discharge transistor is coupled to the output terminal of the drive stage and configured to discharge the output terminal according to the discharge enabling signal.

The present disclosure further provides a liquid crystal panel includes a substrate, a thin film transistor matrix and an integrated gate driver circuit. The thin film transistor matrix is formed on the substrate and has a plurality of gate lines. The integrated gate driver circuit is formed on the substrate and configured to drive the thin film transistor matrix. The integrated gate driver circuit includes a control circuit, a drive stage and a discharge transistor. The control circuit is configured to output a plurality of clock signals within a frame period and output a discharge enabling signal within a blanking period. The drive stage receives the clock signals and includes an output terminal configured to output a gate driving signal. The discharge transistor is coupled to the output terminal of the drive stage and configured to discharge the output terminal according to the discharge enabling signal.

The present disclosure further provides an integrated gate driver circuit includes a control circuit and a drive stage. The control circuit is configured to output a plurality of clock signals within a frame period and output a discharge enabling signal within a blanking period. The drive stage receives the clock signals, and has an output terminal configured to output a gate driving signal and a discharge transistor coupled to the output terminal and configured to discharge the output terminal according to the discharge enabling signal.

In one aspect, each of the drive stages includes an operating transistor having a control terminal, a first terminal and a second terminal. The control terminal receives the clock signals. The first terminal or the second terminal is coupled to the output terminal.

In one aspect, the blanking period is a time interval after the gate driving signal outputted by a last drive stages of the plurality of drive stages and before a next start vertical frame signal; and preferably, the blanking period is between a falling edge of the gate driving signal outputted by the last drive stage of the plurality of drive stages and a rising edge of the next start vertical frame signal.

In one aspect, the control circuit has a negative voltage source configured to output a negative voltage. The first terminal of the discharge transistor is coupled to the terminal; the second of the discharge transistor is coupled to the negative voltage source; and the control terminal of the discharge transistor receives the discharge enabling signal.

In one aspect, a signal duration of the discharge enabling signal is smaller than or equal to the blanking period.

In the integrated gate driver circuit and a liquid crystal panel according to the embodiment of the present disclosure, as the control circuit does not output any clock signal to the drive stages within the blanking period, the derive stages are floated to caused the voltage rise on the output terminal. Therefore, the present disclosure utilizes the discharge enabling signal to discharge the output terminal of every drive stage within the blanking period so as to eliminate the voltage fluctuation on the output terminal and the gate lines of the liquid crystal panel within the blanking period.

BRIEF DESCRIPTION OF THE DRAWINGS

Other objects, advantages, and novel features of the present disclosure will become more apparent from the following detailed description when taken in conjunction with the accompanying drawings.

FIG. 5C shows an operational schematic diagram of the drive stage shown in FIG. 5B, wherein the drive stage is a first drive stage.

DETAILED DESCRIPTION OF THE EMBODIMENT

It should be noted that, wherever possible, the same reference numbers will be used throughout the drawings to refer to the same or like parts.

Figure 1:
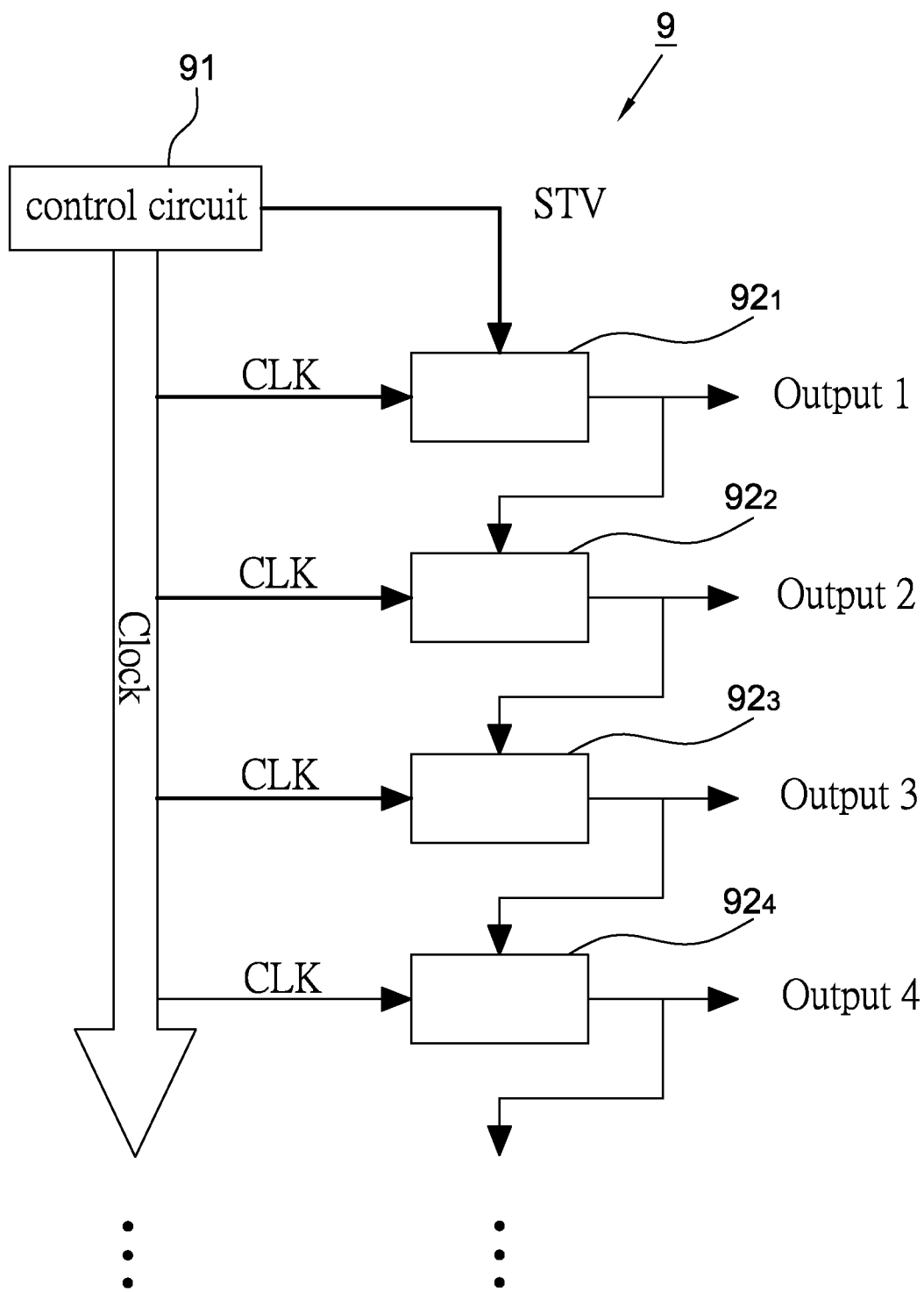
FIG. 1 shows a schematic block diagram of the conventional integrated gate driver circuit.
Figure 2:
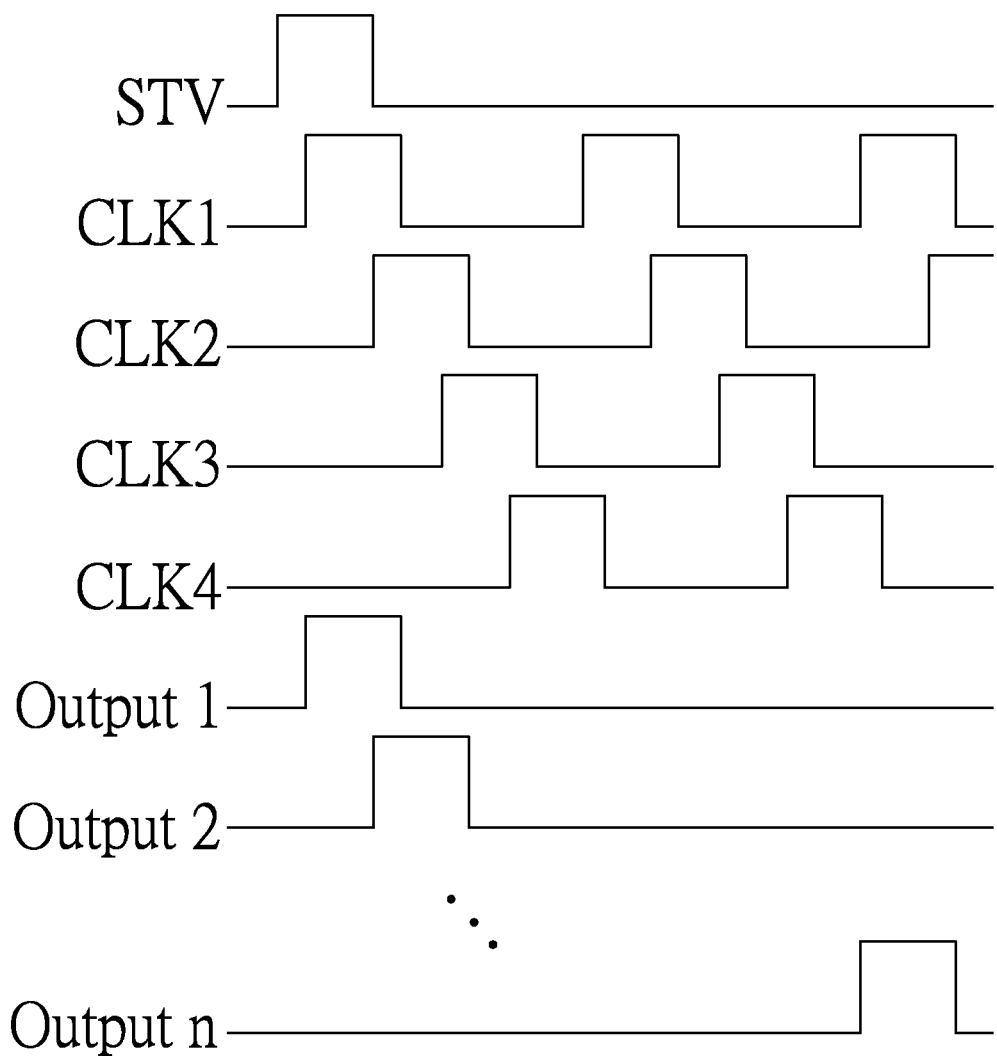
FIG. 2 shows a timing diagram of the integrated gate driver circuit shown in FIG. 1.
Figure 3:
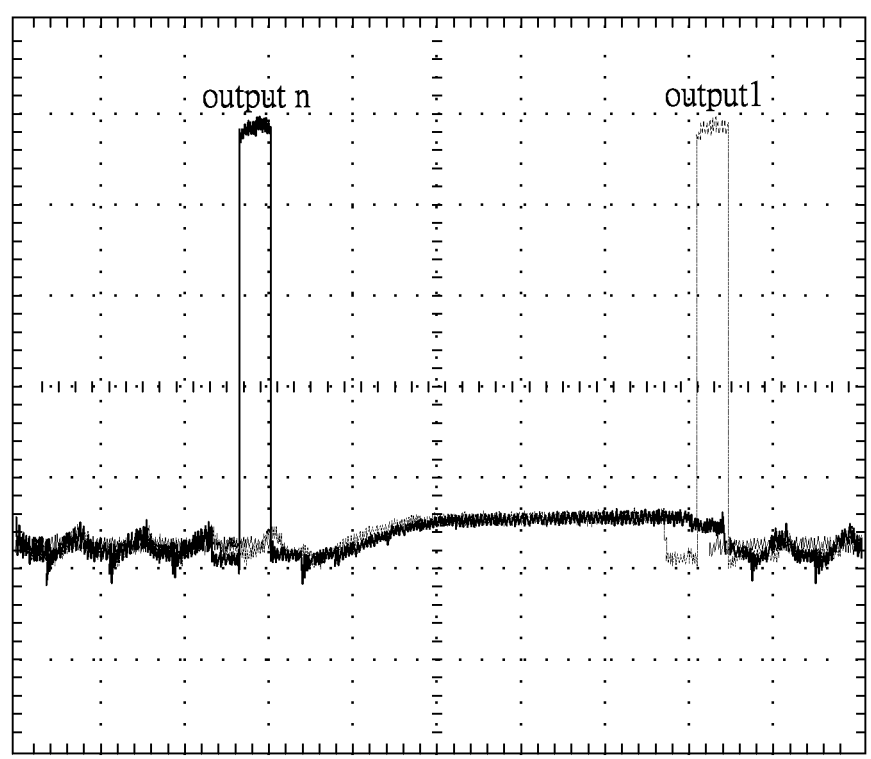
FIG. 3 shows a schematic diagram of output signals of the first drive stage and the last drive stage of the conventional integrated gate driver circuit.
Figure 4A:
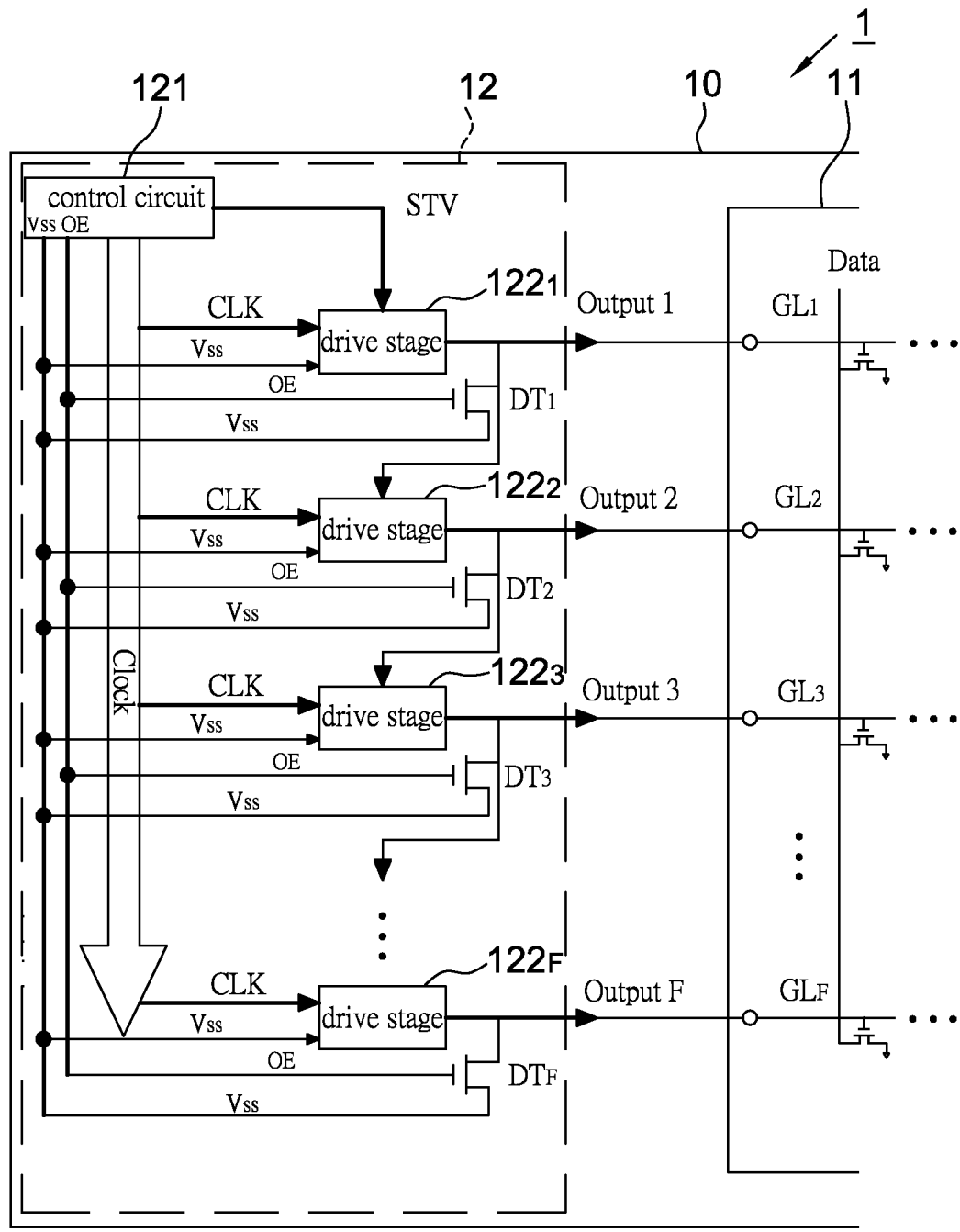
FIGS. 4A and 4B respectively show a schematic diagram of the liquid crystal panel and the integrated gate driver circuit according to an embodiment of the present disclosure.

Referring to FIG. 4A, it shows a schematic block diagram of the liquid crystal panel according to an embodiment of the present disclosure. The liquid crystal panel 1 includes a substrate 10, a thin film transistor matrix 11 and an integrated gate driver circuit 12. The substrate 10 may be a glass substrate or a flexible substrate for forming a thin film transistor matrix in general liquid crystal panels.

The thin film transistor matrix 11 is formed on the substrate 10 and includes a plurality of gate lines $GL_1$-$GL_F$ respectively connected to a row of thin film transistors, wherein the method of forming a thin film transistor matrix on a substrate is well know and recorded in documents and thus details thereof are not described herein.

The integrated gate driver circuit 12 is formed on the substrate 10 together with the thin film transistor matrix 11 and configured to drive the thin film transistor matrix 11. The integrated gate driver circuit 12 includes a control circuit 121, a plurality of drive stages $122_1$-$122_F$ and a plurality of discharge transistors $DT_1$-$DT_F$, wherein the first terminal of the discharge transistors $DT_1$-$DT_F$ is respectively connected to the drive stages $122_1$-$122_F$.

Figure 5A:
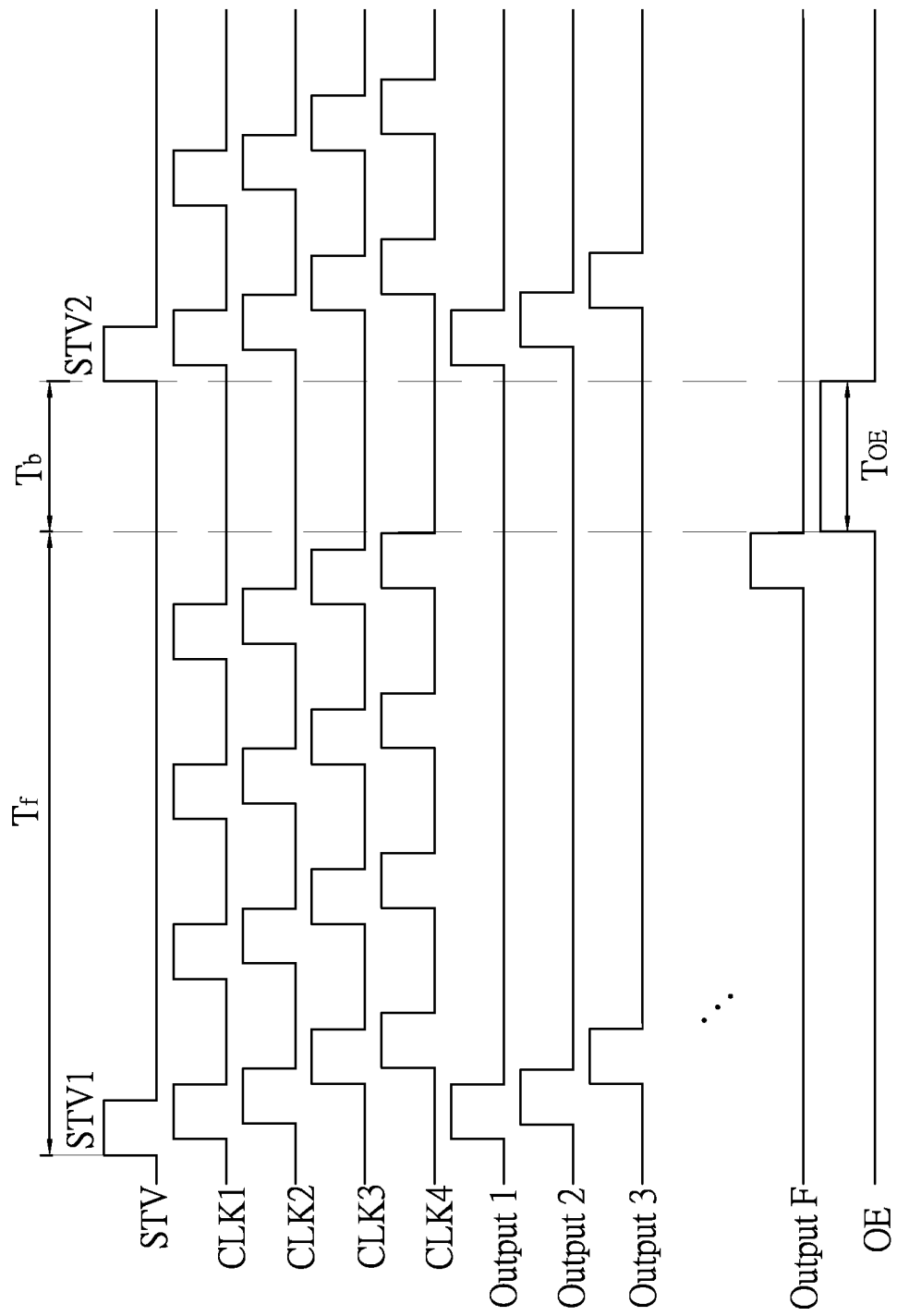
FIG. 5A shows a timing diagram of the integrated gate driver circuit according to the embodiment of the present disclosure.

Further referring to FIG. 5A, the control circuit 121 is configured to output a plurality of clock signals CLK within a frame period $T_f$ and output a discharge enabling signal or an output enable signal OE within a blanking period $T_b$, wherein the control circuit 121 does not output the clock signals CLK within the blanking period $T_b$. The control circuit 121 further includes a negative voltage source configured to provide a negative voltage $V_{SS}$ (or a low voltage, for example −5 volts to −10 volts, but not limited to) to each of the drive stages $122_1$-$122_F$ and each of the discharge transistors $DT_1$-$DT_F$. In another embodiment, the negative voltage or the low voltage provided to the drive stages $122_1$-$122_F$ may be different from that provided to the discharge transistors $DT_1$-$DT_F$.

Each of the drive stages $122_1$-$122_F$ receives the clock signals CLK and has an output terminal, and the drive stages $122_1$-$122_F$ respectively output a gate driving signal Output 1-Output F to one of the gate lines $GL_1$-$GL_F$. It is appreciated that each of the gate lines $GL_1$-$GL_F$ is configured to drive a row of thin film transistors of the thin film transistor matrix 11.

Figure 4B:
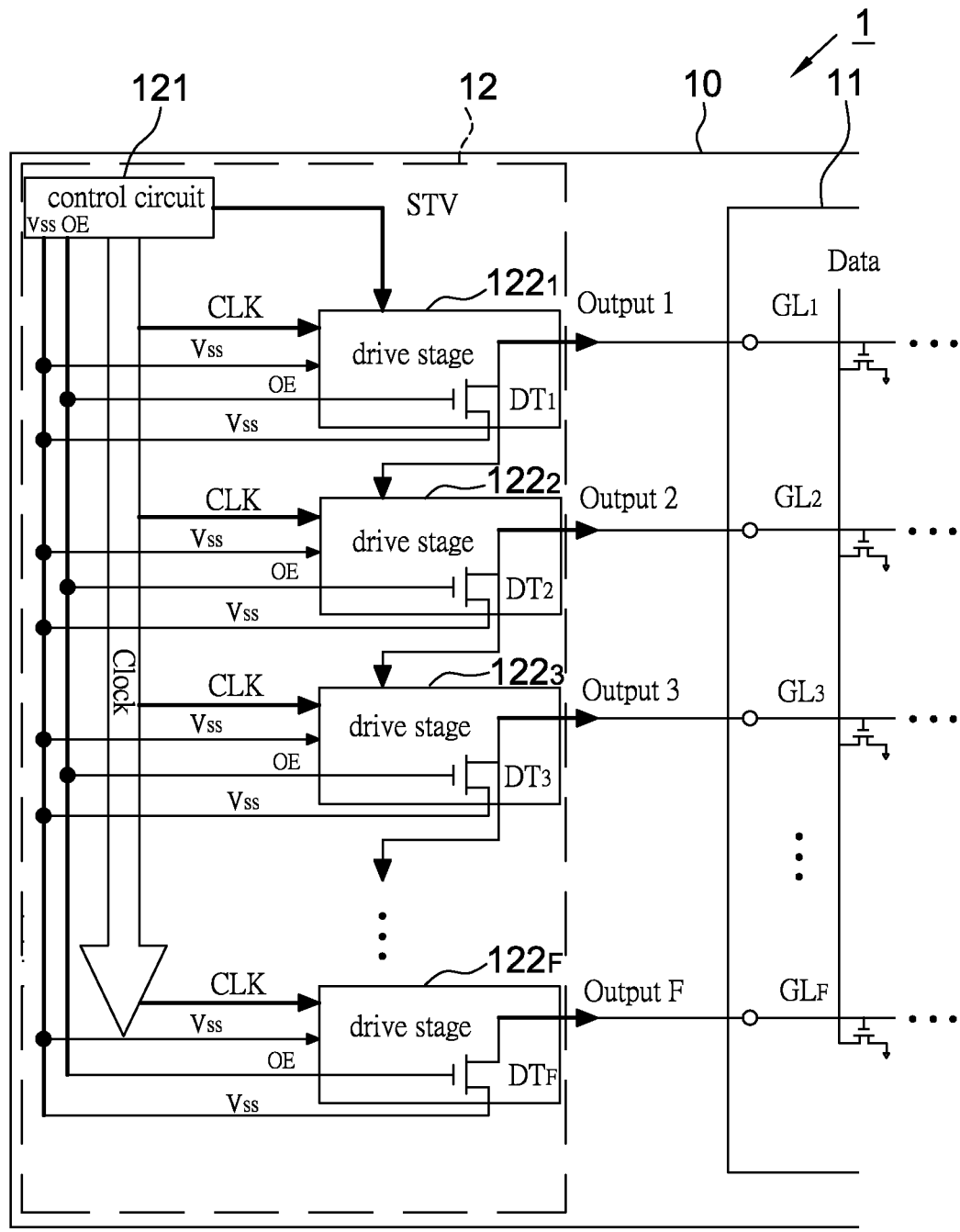

Each of the discharge transistors $DT_1$-$DT_F$ is coupled to the output terminal of one of the drive stages $122_1$-$122_F$ and one of the gate lines $GL_1$-$GL_F$, and configured to discharge the output terminal and the associated gate lines $GL_1$-$GL_F$ according to the discharge enabling signal OE. Each of the discharge transistors $DT_1$-$DT_F$ includes a first terminal, a second terminal and a control terminal, wherein the first terminal is coupled to the output terminal and one of the gate lines $GL_1$-$GL_F$; the second terminal is coupled to the negative voltage $V_{SS}$; and the control terminal receives the discharge enabling signal OE so as to accordingly discharge the output terminal and the associated gate lines $GL_1$-$GL_F$; that is, when the control terminal receives the discharge enabling signal OE, the discharge transistors $DT_1$-$DT_F$ are turned on so as to discharge the output terminal and the associated gate lines $GL_1$-$GL_F$ via the second terminal, e.g. discharging to the negative voltage $V_{SS}$ herein. In the embodiment of the present disclosure, the discharge transistors $DT_1$-$DT_F$ may be thin film transistors that are formed on the substrate 10 together with the drive stages $122_1$-$122_F$ and the thin film transistor matrix 11. In another embodiment, the discharge transistors $DT_1$-$DT_F$ may be respectively included in the drive stages $122_1$-$122_F$ as shown in FIG. 4B. In this embodiment, each of the discharge transistors $DT_1$-$DT_F$ is coupled to one of the gate lines $GL_1$-$GL_F$ through the output terminal of one of the drive stages $122_1$-$122_F$, and configured to discharge the associated gate lines $GL_1$-$GL_F$ according to the discharge enabling signal OE. Each of the discharge transistors $DT_1$-$DT_F$ includes a first terminal, a second terminal and a control terminal, wherein the first terminal is coupled to one of the gate lines $GL_1$-$GL_F$ through the output terminal; the second terminal is coupled to the negative voltage $V_{SS}$; and the control terminal receives the discharge enabling signal OE so as to accordingly discharge the associated gate lines $GL_1$-$GL_F$; that is, when the control terminal receives the discharge enabling signal OE, the discharge transistors $DT_1$-$DT_F$ are turned on so as to discharge the associated gate lines $GL_1$-$GL_F$ via the second terminal to the negative voltage $V_{SS}$.

Referring to FIG. 5A, it shows a timing diagram of the clock signals CLK1-CLK4 and the output signals Output 1-Output F of the integrated gate driver circuit according to the embodiment of the present disclosure. In the beginning of every frame period $T_f$, the control circuit 121 first outputs a start vertical frame signal STV (e.g. STV1 and STV2) to a first drive stage $122_1$ of the plurality of drive stages, wherein the frame period $T_f$ is referred to a time interval that the integrated gate driver circuit 12 drives the gate lines $GL_1$-$GL_F$ once. Between two adjacent frame periods, as the control circuit 121 does not output any clock signal and does not drive any gate line in a time interval, this time interval is referred to the blanking period $T_b$ herein.

The blanking period $T_b$ is a time interval after a last drive stage $122_F$ of the plurality of drive stages outputting the gate driving signal Output F and before a next start vertical frame signal STV2; preferably, the blanking period $T_b$ is between a falling edge of the gate driving signal Output F outputted by the last drive stage $122_F$ and a rising edge of the next start vertical frame signal STV2.

The integrated gate driver circuit and the liquid crystal panel according to the embodiment of the present disclosure generate the discharge enabling signal OE to the discharge transistors $DT_1$-$DT_F$ within the blanking period $T_b$ so as to discharge the output terminal and the gate lines $GL_1$-$GL_F$ through the discharge transistors $DT_1$-$DT_F$. Therefore, a signal duration $T_{OE}$ of the discharge enabling signal OE is preferably smaller than or equal to the blanking period $T_b$.

Figure 5B:
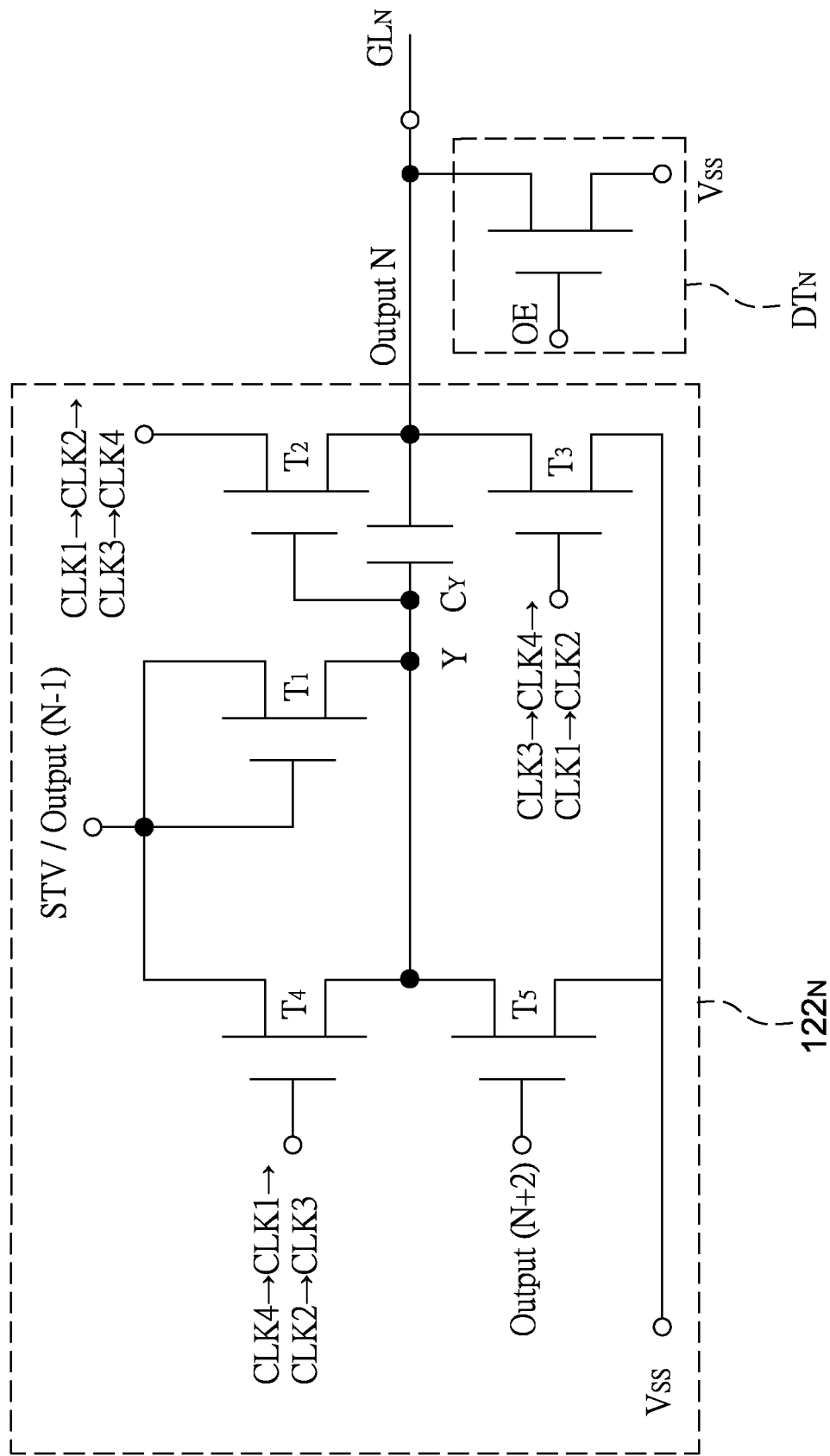
FIG. 5B shows a circuit diagram of one drive stage of the integrated gate driver circuit according to the embodiment of the present disclosure.

Referring to FIG. 5B, it shows a circuit diagram of the Nth drive stage $122_N$ and the Nth discharge transistor $DT_N$ of the integrated gate driver circuit shown in FIG. 4A. The Nth drive stage $122_N$ includes a first transistor $T_1$, a second transistor $T_2$, a third transistor $T_3$, a fourth transistor $T_4$ and a fifth transistor $T_5$, wherein the transistors $T_1$-$T_5$ may be thin film transistors and formed on the substrate 10 together with the thin film transistor matrix 11 and the discharge transistors $DT_1$-$DT_F$. The output terminal of the Nth drive stage $122_N$ is coupled to the Nth discharge transistor $DT_N$ and outputs a gate driving signal Output N to drive one gate line $GL_N$.

A first terminal of the first transistor $T_1$ is coupled to a control terminal of the first transistor $T_1$ and receives a start vertical frame signal STV or a gate driving signal Output (N−1) outputted by a previous drive stage $122_{N-1}$. A second terminal of the first transistor $T_1$ is coupled to a node Y, wherein the node Y is coupled to the output terminal of the Nth drive stage $122_N$ and the gate line $GL_N$ through a capacitor $C_Y$, which is configured to maintain the voltage on the node Y. In another embodiment, the capacitor $C_Y$ may not be implemented.

A first terminal of the second transistor $T_2$ receives the clock signals CLK and a second terminal of the second transistor $T_2$ is coupled to the output terminal and the gate line $GL_N$. A control terminal of the second transistor $T_2$ is coupled to the node Y. In this embodiment, the first terminal may receive the clock signals in a sequence CLK1, CLK2, CLK3 and CLK4 shown in FIG. 5A.

A first terminal of the third transistor $T_3$ is coupled to the output terminal and the gate line $GL_N$. A control terminal of the third transistor $T_3$ receives the clock signals CLK and a second terminal of the third transistor $T_3$ is coupled to the negative voltage $V_{SS}$. In this embodiment, the control terminal may receive the clock signals in a sequence CLK3, CLK4, CLK1 and CLK2 shown in FIG. 5A.

A first terminal of the fourth transistor $T_4$ is coupled to the first terminal and the control terminal of the first transistor $T_1$ so as to receive the start vertical frame signal STV or the gate driving signal Output (N−1) of the previous drive stage $122_{N-1}$. A second terminal of the fourth transistor $T_4$ is coupled to the node Y, and a control terminal of the fourth transistor $T_4$ receives the clock signals CLK. In this embodiment, the control terminal may receive the clock signals in a sequence CLK4, CLK1, CLK2 and CLK3 shown in FIG. 5A.

A first terminal of the fifth transistor $T_5$ is coupled to the node Y. A second terminal of the fifth transistor $T_5$ is coupled to the negative voltage $V_{SS}$ and a control terminal of the fifth transistor $T_5$ is coupled to a second next drive stage $122_{(N+2)}$ of the Nth drive stage $122_N$ to receive the gate driving signal Output (N+2).

Referring to FIG. 5C, it shows an operational schematic diagram of the drive stage shown in FIG. 5B, wherein the drive stage is a first drive stage herein.

In the first drive stage $122_1$, the control circuit 121 outputs a start vertical frame signal STV1 to the first drive stage $122_1$ at the beginning of one frame period $T_f$, and then the control circuit 121 sequentially outputs the clock signals CLK1, CLK2, CLK3 and CLK4 to the first drive stage $122_1$ as shown in FIG. 5A. FIG. 5C shows the operating states of the transistors $T_1$-$T_5$ when sequentially receiving the start vertical frame signal STV1 and the clock signals CLK1-CLK4 and the voltages on the node Y and gate driving signal Output 1, wherein "H" indicates a digit value "1" and "L" indicates a digit value "0" and actual voltage values associated with "H" and "L" may be determined according to actual applications. For example in one embodiment, "H" may be +15 volts and "L" may be −5 volts, but not limited thereto.

In FIG. 5A, when the last drive stage $122_F$ outputs a gate driving signal Output F to drive the last gate line $GL_F$ of the thin film transistor matrix 11, one frame period $T_f$ is ended. Next, when the control circuit 121 sends another start vertical frame signal STV2, a next frame period $T_f$ is started. More specifically speaking, the frame period $T_f$ is a time interval that the integrated gate driver circuit 12 drives the gate lines $GL_1$-$GL_F$ once; that is, a time interval between a rising edge of the start vertical frame signal STV and a falling edge of the gate driving signal Output F outputted by the last drive stage $122_F$.

It should be mentioned that a circuit structure of every drive stage of the present disclosure is not limited to that shown in FIG. 5B as long as the circuit structure includes an operating transistor and an output terminal, and a control terminal of the operating transistor receives the clock signals CLK so as to discharge the output terminal and the gate line coupled to a first terminal or a second terminal of the operating transistor in at least a part of the frame period $T_f$. For example, the operating transistor in FIG. 5B is the third transistor $T_3$, and when the control terminal of the third transistor $T_3$ is turned on by the clock signals, the third transistor $T_3$ may discharge the output terminal coupled to the first terminal thereof and the associated gate line. It should be mentioned that charges on the output terminal are not limited to be discharged to the negative voltage $V_{SS}$ or a low voltage through the operating transistor, and the charges may be discharged to a signal source of the clock signals in other embodiments. In the present disclosure, the drive stages of the integrated gate driver circuit may use any proper circuit structure as long as discharge transistors $DT_1$-$DT_F$ are respectively disposed at the output terminal of every drive stage and the discharge enabling signal OE is send to the discharge transistors $DT_1$-$DT_F$ within the blanking period $T_b$ between two image frames so as to discharge the output terminals and the gate lines $GL_1$-$GL_F$. The blanking period $T_b$ and/or the frame period $T_f$ may be determined according to an actual size of the liquid crystal panel.

As mentioned above, in the conventional integrated gate driver circuit the voltage fluctuation can occur on the gate line within a blanking period between two image frames so as to influence the image output. Therefore, the present disclosure further provides an integrated gate driver circuit and a liquid crystal display (FIGS. 4A and 4B) that utilize a discharge transistor to discharge the output voltage within a blanking period between two image frames so as to effectively eliminate the voltage fluctuation on the gate lines.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. An integrated gate driver circuit, comprising:
   a control circuit configured to output a plurality of clock signals including a first clock signal, a second clock signal, a third clock signal and a fourth clock signal within a frame period and output a discharge enabling signal within a blanking period;
   a drive stage configured to receive the clock signals, the drive stage having an output terminal configured to output a gate driving signal, the drive stage further comprising:
   a first transistor having a first terminal, a second terminal coupled to a node, and a first control terminal coupled to the first terminal;
   a second transistor having a third terminal configured to receive the clock signals in a sequence of the first, second, third and fourth clock signals, a fourth terminal coupled to the output terminal, and a second control terminal coupled to the node;
   a third transistor having a fifth terminal coupled to the output terminal, a sixth terminal, and a third control terminal configured to receive the clock signals in a sequence of the third, fourth, first and second clock signals;
   a fourth transistor having a seventh terminal coupled to the first terminal and the first control terminal of the first transistor, an eighth terminal coupled to the node, and a fourth control terminal configured to receive the clock signals in a sequence of the fourth, first, second and third clock signals; and
   a fifth transistor having a ninth terminal coupled to the node, a tenth terminal coupled to the sixth terminal of the third transistor, and a fifth control terminal; and
   a discharge transistor coupled to the output terminal of the drive stage and configured to discharge the output terminal according to the discharge enabling signal.

2. The integrated gate driver circuit as claimed in claim 1, wherein the control circuit is configured to not output the clock signals within the blanking period.

3. The integrated gate driver circuit as claimed in claim 1, wherein the control circuit comprises a negative voltage source configured to provide a negative voltage.

4. The integrated gate driver circuit as claimed in claim 3, wherein the negative voltage is provided to the drive stage.

5. The integrated gate driver circuit as claimed in claim 3, wherein the discharge transistor has an eleventh terminal coupled to the output terminal, a twelfth terminal coupled to the negative voltage source, and a sixth control terminal configured to receive the discharge enabling signal.

6. The integrated gate driver circuit as claimed in claim 1, wherein
   the integrated gate driver circuit comprises a plurality of drive stages, and
   the control circuit is further configured to output a start vertical frame signal to a first drive stage among the plurality of drive stages in the beginning of the frame period.

7. The integrated gate driver circuit as claimed in claim 6, wherein the blanking period is between the gate driving signal outputted by a last drive stage among the plurality of drive stages and a next start vertical frame signal.

8. The integrated gate driver circuit as claimed in claim 1, wherein a signal duration of the discharge enabling signal is smaller than or equal to the blanking period.

9. The integrated gate driver circuit as claimed in claim 1, wherein the third transistor is configured as an operating transistor.

10. A liquid crystal panel, comprising:
    a substrate;
    a thin film transistor matrix formed on the substrate and comprising a plurality of gate lines;
    an integrated gate driver circuit as claimed in claim 1, formed on the substrate and configured to drive the thin film transistor matrix.

11. The liquid crystal panel as claimed in claim 10, wherein the control circuit is configured to not output the clock signals within the blanking period.

12. The liquid crystal panel as claimed in claim 10, wherein the control circuit comprises a negative voltage source configured to provide a negative voltage.

13. The liquid crystal panel as claimed in claim 12, wherein the negative voltage is provided to the drive stage.

14. The liquid crystal panel as claimed in claim 12, wherein the discharge transistor has an eleventh terminal coupled to the output terminal, a twelfth terminal coupled to the negative voltage source, and a sixth control terminal configured to receive the discharge enabling signal.

15. The liquid crystal panel as claimed in claim 10, wherein
    the integrated gate driver circuit comprises a plurality of drive stages, and
    the control circuit is further configured to output a start vertical frame signal to a first drive stage among the plurality of drive stages in the beginning of the frame period.

16. The liquid crystal panel as claimed in claim 15, wherein the blanking period is between the gate driving signal outputted by a last drive stage among the plurality of drive stages and a next start vertical frame signal.

17. The liquid crystal panel as claimed in claim 10, wherein a signal duration of the discharge enabling signal is smaller than or equal to the blanking period.

18. The liquid crystal panel as claimed in claim 10, wherein the third transistor is configured as an operating transistor.

19. An integrated gate driver circuit, comprising:
    a control circuit configured to output a plurality of clock signals including a first clock signal, a second clock signal, a third clock signal and a fourth clock signal within a frame period and output a discharge enabling signal within a blanking period; and
    a drive stage configured to receive the clock signals, the drive stage having an output terminal configured to output a gate driving signal and a discharge transistor coupled to the output terminal and configured to discharge the output terminal according to the discharge enabling signal;

wherein the drive stage further comprises:
- a first transistor having a first terminal, a second terminal coupled to a node, and a first control terminal coupled to the first terminal;
- a second transistor having a third terminal configured to receive the clock signals in a sequence of the first, second, third and fourth clock signals, a fourth terminal coupled to the output terminal, and a second control terminal coupled to the node;
- a third transistor having a fifth terminal coupled to the output terminal, a sixth terminal, and a third control terminal configured to receive the clock signals in a sequence of the third, fourth, first and second clock signals;
- a fourth transistor having a seventh terminal coupled to the first terminal and the first control terminal of the first transistor, an eighth terminal coupled to the node, and a fourth control terminal configured to receive the clock signals in a sequence of the fourth, first, second and third clock signals; and
- a fifth transistor having a ninth terminal coupled to the node, a tenth terminal coupled to the sixth terminal of the third transistor, and a fifth control terminal.

20. The integrated gate driver circuit as claimed in claim 19, wherein
- the integrated gate driver circuit is configured to be applied to a liquid crystal panel comprising a substrate and a thin film transistor;
- the integrated gate driver circuit is configured to be formed on the substrate and configured to drive a thin film transistor matrix which is formed on the substrate and comprises a plurality of gate lines.

* * * * *